United States Patent
Daubenspeck et al.

(10) Patent No.: US 6,667,533 B2
(45) Date of Patent: Dec. 23, 2003

(54) TRIPLE DAMASCENE FUSE

(75) Inventors: Timothy H. Daubenspeck, Colchester, VT (US); Thomas L. McDevitt, Underhill, VT (US); William T. Motsiff, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 09/684,000

(22) Filed: Mar. 11, 2002

(65) Prior Publication Data
US 2003/0168714 A1 Sep. 11, 2003

(51) Int. Cl.$^7$ ............................................... H01L 29/00
(52) U.S. Cl. ..................... 257/529; 257/296; 257/642; 257/643; 438/132; 438/215; 438/281; 438/333
(58) Field of Search .................. 438/132, 215, 438/281, 333; 257/296, 642, 643

(56) References Cited

U.S. PATENT DOCUMENTS

| 4,873,506 A | 10/1989 | Gurevich |
| 5,420,455 A | 5/1995 | Gilmour et al. |
| 5,663,590 A | 9/1997 | Kapoor |
| 5,960,254 A | 9/1999 | Cronin |
| 6,261,873 B1 * | 7/2001 | Bouldin et al. ............. 438/132 |

OTHER PUBLICATIONS

IBM Technical Disclosure Bulletin, vol. 32, No. 3A, Aug. 1989, Fuse Structure for Wide Fuse Materials Choice, pp. 438–439.

IBM Technical Disclosure Bulletin, vol. 32, No. 8A, Jan. 1990, Method to Incorporate Three Sets of Pattern Information in Two Photomasking Steps, pp. 218–219.

* cited by examiner

*Primary Examiner*—David Nelms
*Assistant Examiner*—Mai-Huong Tran
(74) *Attorney, Agent, or Firm*—Schmeiser, Olsen & Watts; William D. Sabo

(57) ABSTRACT

Disclosed is a conductive fuse for a semiconductor device, comprising: a pair of contact portions integrally connected to a fusible portion by connecting portions; the contact portions thicker than the connecting portions and the connecting portions thicker than the fusible portion; a first dielectric under the connecting portions and the fusible portion and extending between the pair of contact portions; and a second dielectric between the first dielectric and the fusible portion, the second dielectric extending between the connecting portions and defining the length of the fusible portion.

30 Claims, 9 Drawing Sheets

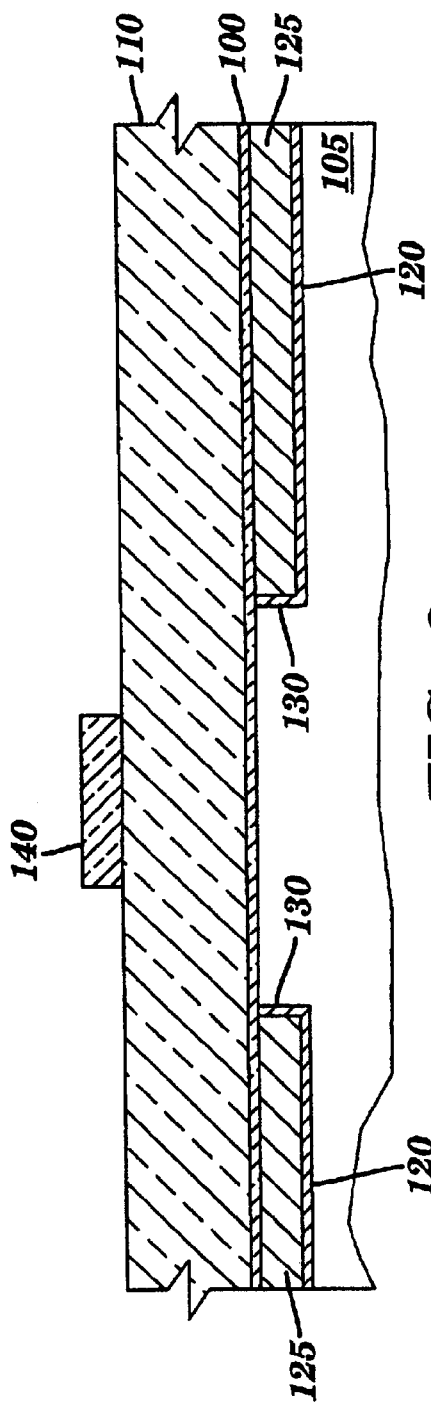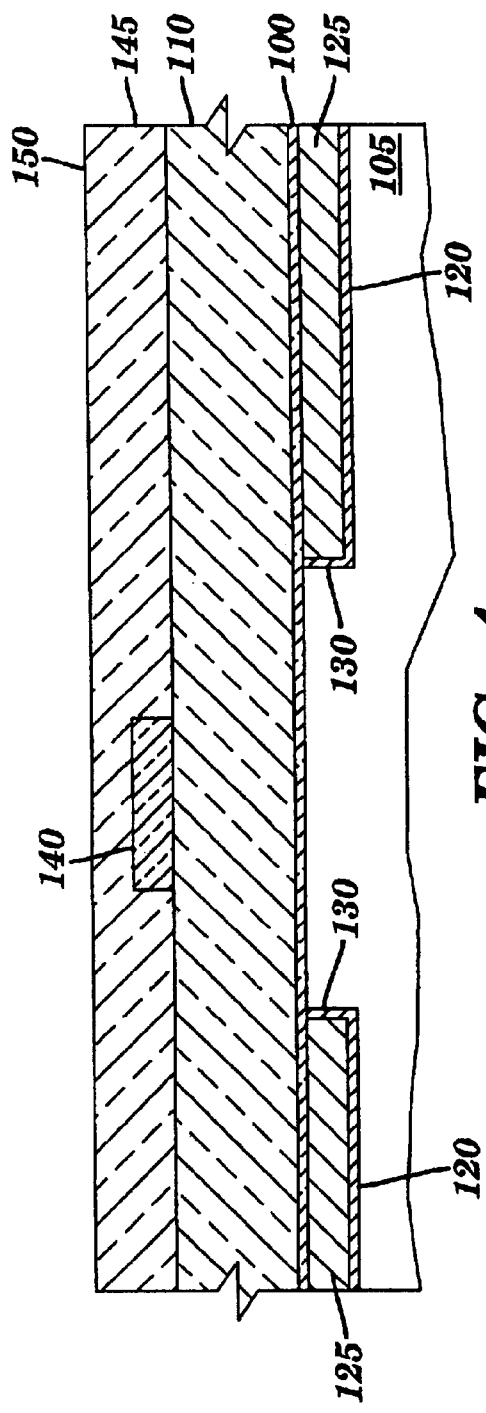

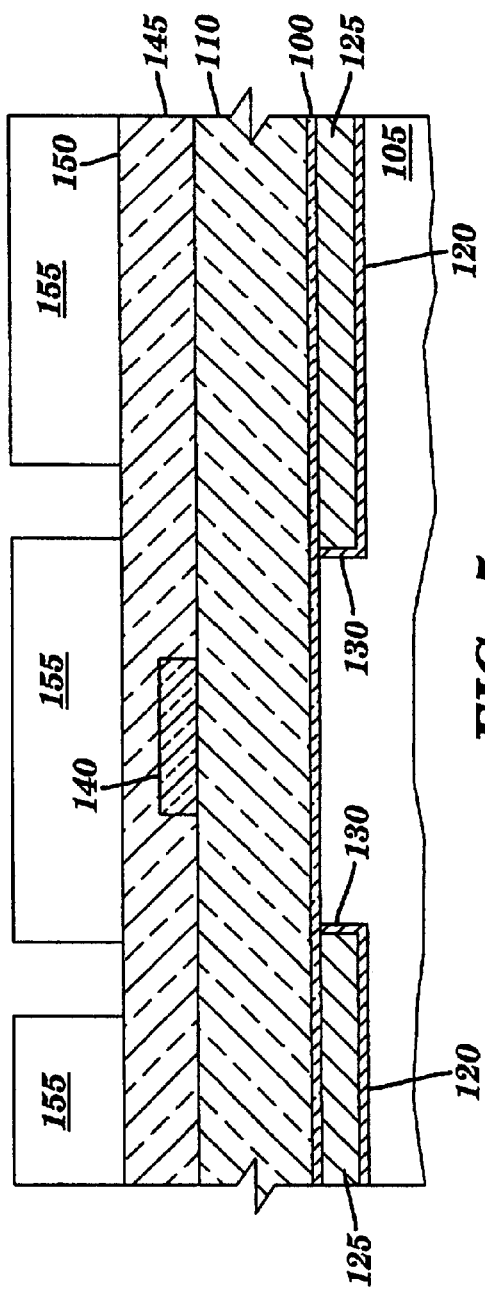
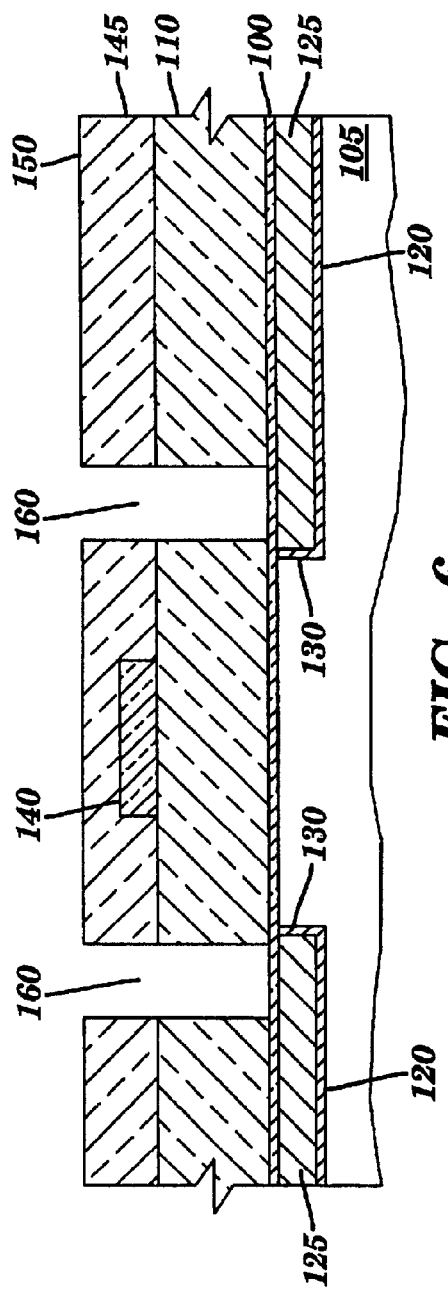

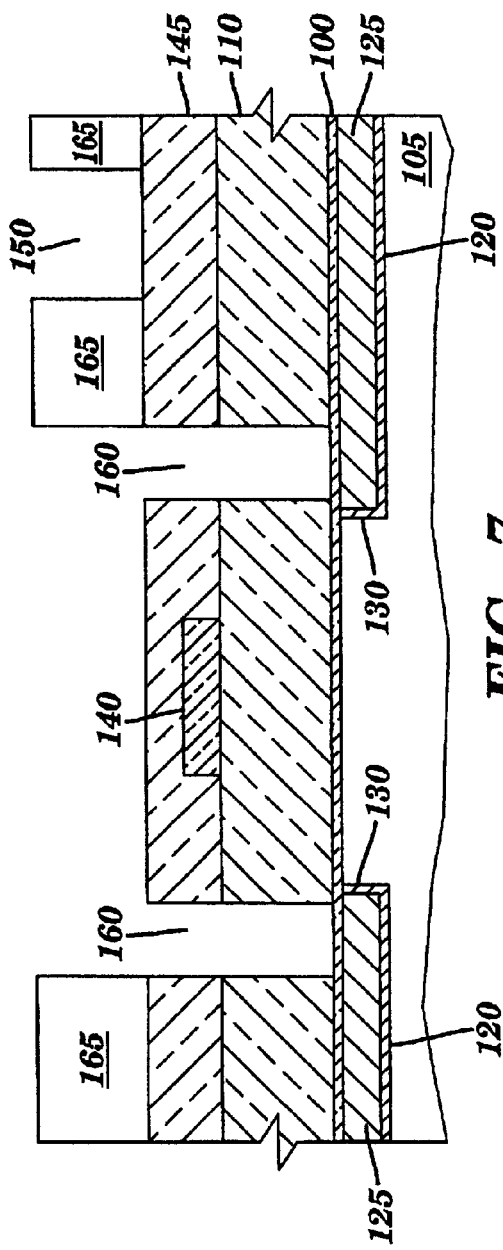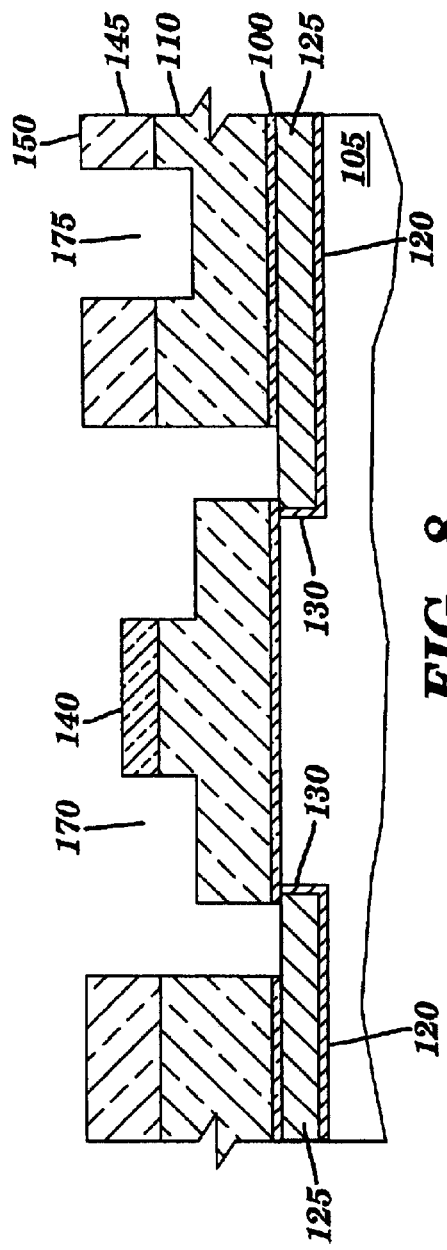

US 6,667,533 B2

TRIPLE DAMASCENE FUSE

BACKGROUND OF THE INVENTION

1. Field of the Invention

The present invention relates to the field of semiconductor integrated circuits; more specifically, it relates to a fuse for semiconductor integrated circuits and the method of fabricating said fuse.

2. Background of the Invention

Semiconductor integrated circuits include a semiconductor substrate containing active devices, such as transistors and diodes, passive devices, such as capacitors and resistors and interconnection layers formed on top of the substrate containing wires for joining the active and passive devices into integrated circuits.

Many semiconductor devices such as logic circuits such as complementary metal-oxide-silicon (CMOS), Bipolar, and BiCMOS and memory devices such as dynamic random access memory (DRAMs) and static random access memory (SRAMs) are designed to be tailored after manufacture by "blowing fuses" (deleting fuses.) Tailoring includes adjusting circuit parameters and deleting failed circuit elements and replacing them with redundant circuit elements.

Fuses are usually formed from narrow wires in the interconnection layers designed to be opened by vaporizing a portion of the wire by either passing an electric current through the fuse or now more commonly by a laser pulse. Modern semiconductor integrated circuits often require many thousands of fuses arranged in closely spaced banks. Fuses are most often located in the uppermost interconnection wiring levels in order to minimize damage to adjoining structures, to minimize the thickness of dielectric passivation covering the fuse and to allow an optically clear path for a laser to the fuse.

Many semiconductor integrated circuits use a hierarchical wiring scheme; thin, tight pitched wiring in lower wiring levels for performance purposes and thick, relaxed pitch wiring in higher wiring levels for current carrying requirements. Fuses fabricated in these higher wiring levels being formed of thick metal require high fuse energy to vaporize than fuses formed in thin wiring levels. Since fuses generally must be formed in upper levels of wiring for the reasons given above a difficult problem is created. The high power, for example of a laser, required to delete thick fuses can create similar collateral damage to adjoining fuses and wires (resulting in reduced yields) as well as create cracks and craters in the dielectric layers separating wiring levels (resulting in reliability problems) that locating the fuse in lower wiring levels can cause. Further, thick fuses must often be spaced wide apart to reduce these problems resulting in an excessive area of the die being required for fuses.

Dielectric damage is also a great concern when low-k dielectric materials are used between wiring levels. Low-k dielectrics are generally not thermally stable, have a low modulus and can melt, deform, or collapse when subjected to thermal and mechanical stress, such as induced by fuse blow. Examples of low-k dielectrics include spin on glass, porous silicon oxide, polyimide, polyimide siloxane, polysilsequioxane polymer, benzocyclobutene, paralyene, polyolefin, poly-naphthalene, amorphous Teflon (a fluropolymer resin), SiLK™ (a polyphenylene oligomer and described in U.S. Pat. No. 5,965,679) manufactured by Dow Chemical, Midland, Mich., Black Diamond™ (silica doped with about 10 mole % methane), manufactured by Applied Materials Corp., polymer foam and aerogel. Common dielectrics include silicon oxide, silicon nitride, diamond, and fluorine doped silicon oxide.

SUMMARY OF THE INVENTION

A first aspect of the present invention is a conductive fuse for a semiconductor device, comprising: a pair of contact portions integrally connected to a fusible portion by connecting portions; the contact portions thicker than the connecting portions and the connecting portions thicker than the fusible portion; a first dielectric under the connecting portions and the fusible portion and extending between the pair of contact portions; and a second dielectric between the first dielectric and the fusible portion, the second dielectric extending between the connecting portions and defining the length of the fusible portion.

A second aspect of the present invention is a method for fabricating a fuse for a semiconductor device, comprising: providing a substrate; forming a first dielectric layer on a top surface of the substrate; forming a dielectric mandrel on a top surface of the first dielectric layer; forming a second dielectric layer on top of the mandrel and a top surface of the first dielectric layer; forming contact openings down to the substrate in the first and second dielectric layers on opposite sides of the mandrel; removing the first dielectric layer from over the mandrel between the contact openings to form a trough; and filling the trough and contact openings with a conductor.

A third aspect of the present invention is a method for fabricating a fuse for a semiconductor device, comprising: providing a substrate; forming a first dielectric layer on a top surface of the substrate; forming a dielectric mandrel on a top surface of the first dielectric layer; forming a second dielectric layer on top of the mandrel and a top surface of the first dielectric layer; forming, in a first region, contact openings down to the substrate in the first and second dielectric layers on opposite sides of the mandrel; removing the first dielectric layer from over the mandrel and the first dielectric layer and a portion of the first dielectric layer between the contact openings and the mandrel to form a trough and simultaneously, in a second region, removing the first dielectric layer and a portion of the second dielectric to form a trench; and filling the trough and contact openings with a conductor to form a fuse and filling the trench with the conductor to form a wire.

A fourth aspect of the present invention is a semiconductor device, comprising: a semiconductor substrate having integrated circuits; and at least one fuse, the fuse comprising: a pair of contact portions integrally connected to a fusible portion by connecting portions; the contact portions thicker than the connecting portions and the connecting portions thicker than the fusible portion; a first dielectric under the connecting portions and the fusible portion and extending between the pair of contact portions; and a second dielectric between the first dielectric and the fusible portion, the second dielectric extending between the connecting portions and defining the length of the fusible portion.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1 through 10 are partial cross-section views illustrating the fabrication of a triple damascene fuse is according to the present invention.

DETAILED DESCRIPTION OF THE INVENTION

Figure 1:
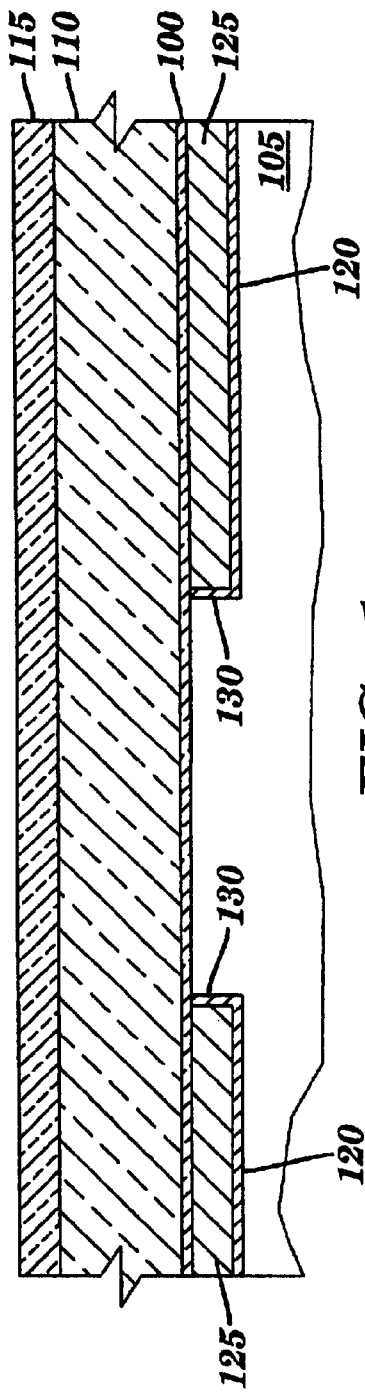

FIGS. 1 through 10, are partial cross-section views illustrating the fabrication of a triple damascene fuse is according to the present invention. In FIG. 1, a barrier layer 100 is formed on a substrate 105. In one example, barrier layer 100 is silicon nitride and is about 0.03 to 0.10 microns thick. Formed on top of barrier layer 100 is a first dielectric layer 110. In one example, first dielectric layer 110 is silicon oxide or fluoridated silicon oxide and is about 0.80 to 2.0 microns thick. In a second example, first dielectric layer 110 is a low-k dielectric such as spin on glass, porous silicon oxide, polyimide, polyimide siloxane, polysilsequioxane polymer, benzocyclobutene, paralyene, polyolefin, poly-naphthalene, amorphous Teflon (a fluropolymer resin), SiLK™ (a polyphenylene oligomer) manufactured by Dow Chemical, Midland, Mich., Black Diamond™ (silica doped with about 10 mole % methane), manufactured by Applied Materials Corp., polymer foam or aerogel. Formed on top of first dielectric layer 110 is a mandrel layer 115. In one example, mandrel layer 115 is silicon nitride, silicon carbide, boron nitride or aluminum oxide and is about 0.15 to 0.50 microns thick. Formed in substrate 105 is a pair of conductive wires 120. Conductive wires 120 are electrically connected to circuits in substrate 105. Conductive wires 120 comprise a core conductor 125 and a liner 130. In one example, core conductor 125 is copper and liner 130. In a second example, core conductor 125 is aluminum or aluminum-copper, aluminum-copper-silicon or aluminum alloy. In one example liner 130 is formed from, titanium, titanium nitride, tungsten, tungsten nitride, tantalum, tantalum nitride, chromium or layers thereof.

Figure 2:
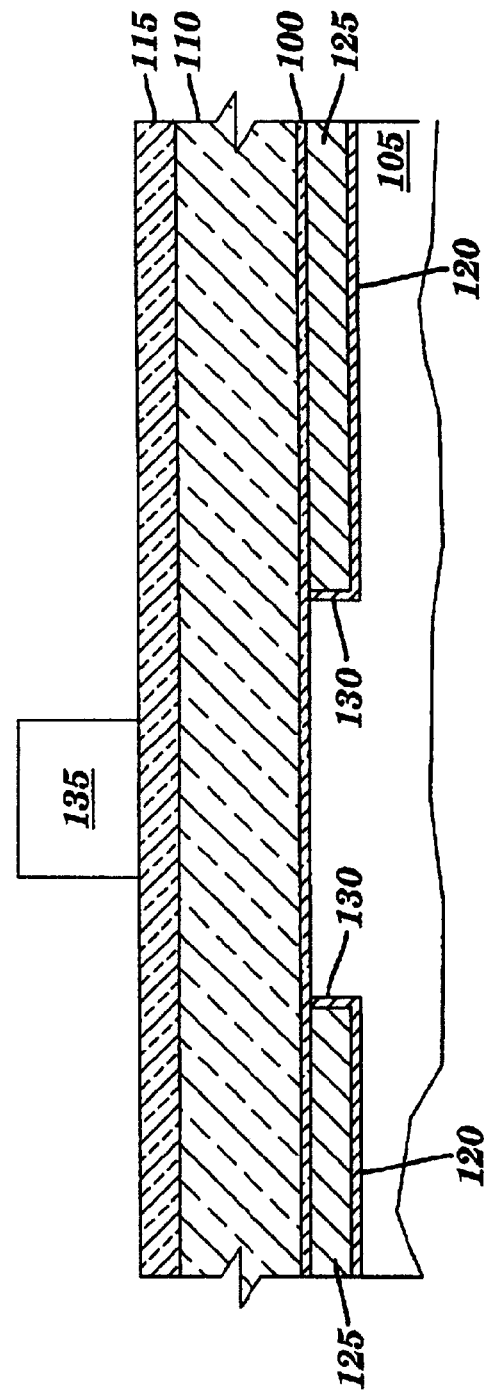

In FIG. 2, a first photolithographic process is performed to form a first photoresist pattern 135 on top of mandrel layer 115. First photoresist pattern 135 is used as an etch mask to form a mandrel in mandrel layer 115 as illustrated in FIG. 3 and described below.

In FIG. 3, a first reactive ion etch (RIE) is performed and first photoresist pattern 135 removed to form mandrel 140. In the example, where mandrel layer 115 is silicon nitride and first dielectric layer 110 is silicon oxide, the first RIE process chemistry is selected to be selective to silicon nitride over silicon oxide and comprises about 30 to 40 SCCM of $CF_4$, about 3 to 10 SCCM of $O_2$ and about 450 to 500 SCCM of Ar.

In FIG. 4, a second dielectric layer 145 is formed on top of first dielectric layer 110 and mandrel 140 and polished using a first chemical-mechanical-polish (CMP) process to form a flat top surface 150. In one example, second dielectric layer is silicon oxide or fluoridated silicon oxide and is about 0.20 to 0.9 microns thick. In a second example, second dielectric layer 145 is a low-k dielectric such as spin on glass, porous silicon oxide, polyimide, polyimide siloxane, polysilsequioxane polymer, benzocyclobutene, paralyene, polyolefin, poly-naphthalene, amorphous Teflon (a fluropolymer resin), SiLK™ (a polyphenylene oligomer) (Dow Chemical, Midland, Mich.), polymer foam or aerogel. It should be understood that many spun on low-k materials (for example, paralene's) do not require a CMP process step as they are self planarizing when applied.

In FIG. 5, a second photolithographic process is performed to form a second photoresist pattern 155 on top of second dielectric layer 145. Second photoresist pattern 155 is used as an etch mask to form a contact hole down to conductive wires 120 as illustrated in FIG. 6 and described below.

In FIG. 6, a second RIE is performed and second photoresist pattern 155 removed to form a pair of contact holes 160 in first and second dielectric layers 110 and 145 down to barrier layer 100. Contact holes 160 are aligned to conductive wires 120. In the example, where barrier layer 100 is silicon nitride and first and second dielectric layers 110 and 145 are silicon oxide, the second RIE process chemistry is selected to be selective to silicon oxide over silicon nitride and comprises about 15 to 45 SCCM of $CF_4$, about 15 to 45 SCCM of $CHF_3$, about 3 to 10 SCCM of $O_2$ and about 450 to 500 SCCM of Ar. A second suitable etch chemistry comprises about 15 to 45 SCCM of $C_2F_6$, about 15 to 45 SCCM of $CH_3F$, about 3 to 10 SCCM of $O_2$ and about 450 to 500 SCCM of Ar.

In FIG. 7, a third photolithographic process is performed to form a third photoresist pattern 165 on top of second dielectric layer 145. Third photoresist pattern 165 is used as an etch mask to form a trough in first and second dielectric layers 110 and 145 that defines the triple damascene fuse geometry and a trench in the second dielectric layer that defines normal last metal (LM) wiring as illustrated in FIG. 8 and described below.

In FIG. 8, a third RIE is performed to form a trough 170 in first and second dielectric layers 110 and 145 and a trench 175 in second dielectric layer 145 and third photoresist pattern 165 is removed. In the example, where barrier layer 100 and mandrel 140 are silicon nitride and first and second dielectric layers 110 and 145 are silicon oxide, the third RIE process chemistry is selected to be selective to silicon oxide over silicon nitride and comprises about 15 to 45 SCCM of $CF_4$, about 15 to 45 SCCM of $CHF_3$, about 3 to 10 SCCM of $O_2$ and about 450 to 500 SCCM of Ar. A second suitable etch chemistry comprises about 15 to 45 SCCM of $C_2F_6$, about 15 to 45 SCCM of $CH_3F$, about 3 to 10 SCCM of $O_2$ and about 450 to 500 SCCM of Ar. All exposed second dielectric 145 is etched away but only a portion of first dielectric layer 110 is etched away.

These chemistries do not significantly etch silicon nitride, so most of mandrel 140 and barrier layer 100 are not removed. Mandrel 140 protects the portion of second dielectric layer 145 under the mandrel from being etched and barrier layer 100 protects core conductor 125 from exposure oxide RIE photoresist strip processes. Protecting core conductor 125 is especially important when the core conductor comprises copper and oxygen-containing RIE processes and oxygen plasma and/or oxidizing acid photoresist strip processes are used. After removal of third photoresist pattern 165, (assuming the barrier layer 100 and mandrel 140 are silicon nitride and first and second dielectric layers 110 and 145 are silicon oxide) those portions of barrier layer 100 exposed in contact holes 160 are removed by a fourth RIE process selective to silicon nitride over silicon oxide which comprises about 30 to 40 SCCM of $CF_4$, about 3 to 10 SCCM of $O_2$ and about 450 to 500 SCCM of Ar. Since mandrel 140 is exposed, a portion of the mandrel of approximately the same thickness as barrier layer 100 is also removed. Thus it is possible to completely remove mandrel 140 depending on the relative thicknesses and etch rates of the mandrel and barrier layer 100.

Figure 9:
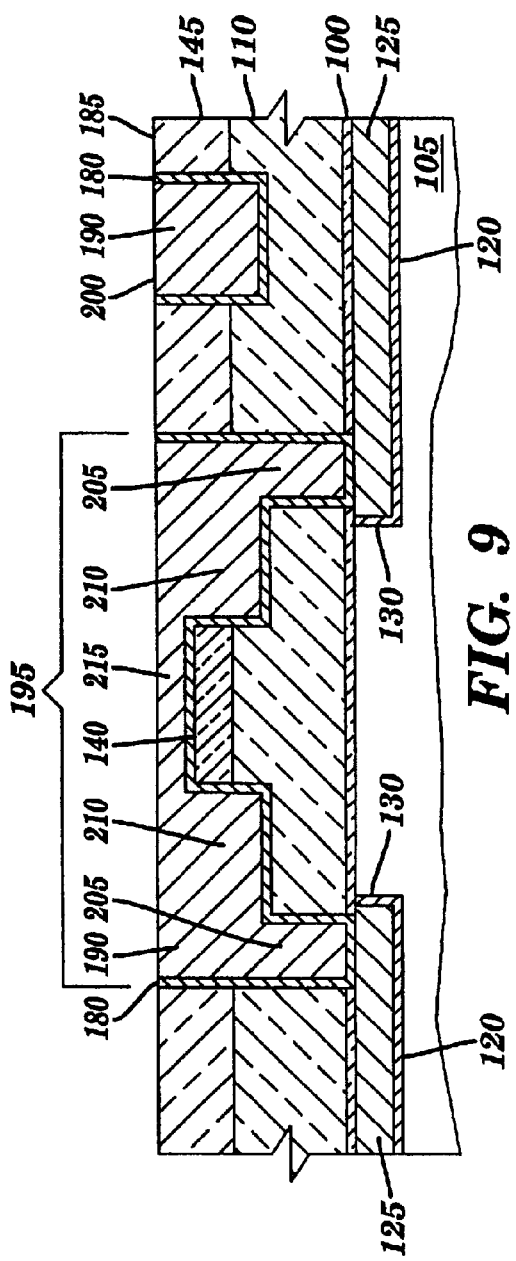

In FIG. 9, a conformal liner 180 is deposited on all surfaces of trough 170 and trench 175 as well as on a top surface 185 of second dielectric layer 145. A core conductor 190 is deposited sufficiently thick to completely fill trough 170 and trench 175. A second CMP process is performed to remove excess liner and core conductor from top surface 185 of second dielectric layer 145 and to polish a fuse 195 and a wire 200 co-planer with the top surface of the second dielectric layer.

The thickness of the second dielectric layer 145 and the depth of the third RIE into first dielectric 110 will largely determine the thickness of wire 200. In one example, wire 200 is about 0.13 to 0.55 microns thick. In a second example, wire 200 is about 0.7 to 2.0 microns thick. In a third example, wire 200 is about 0.13 to 2.0 microns thick.

Fuse 195 includes a contact portion 205 integral with a connecting portion 210, which is integral with a fusible portion 215. Note, if mandrel 140 was removed during the etch of barrier layer 100, fusible portion 215 would be thicker by thickness of the mandrel layer. The thickness of second dielectric layer 145 and mandrel 140 will largely determine the thickness of fusible portion 215 of fuse 195. The thickness of the second dielectric layer 145 and the depth of the third RIE into first dielectric 110 will largely determine the thickness of connecting portion 210. In one example, connecting portion 205 is about 0.13 to 0.55 or about 0.7 to 2.0 microns thick or about 0.13 to 2.0 microns thick with core conductor 190 comprising copper and with liner 185 comprising a layer of about 0.01 to 0.14 microns of tantalum over a layer of about 0.005 to 0.070 microns of tantalum nitride. The total thickness of fusible portion 215 is 0.075 to 1.5 microns thick. In a second example, core conductor 190 comprises aluminum or aluminum-copper, aluminum-copper-silicon or aluminum alloy and liner 195 comprises titanium over titanium nitride, the thickness of the layers being the same as for TaN/Ta/Cu example above. Other liner materials include tungsten, tungsten nitride and chromium, the liner total thicknesses being about 0.015 to 0.21 microns.

Figure 10:
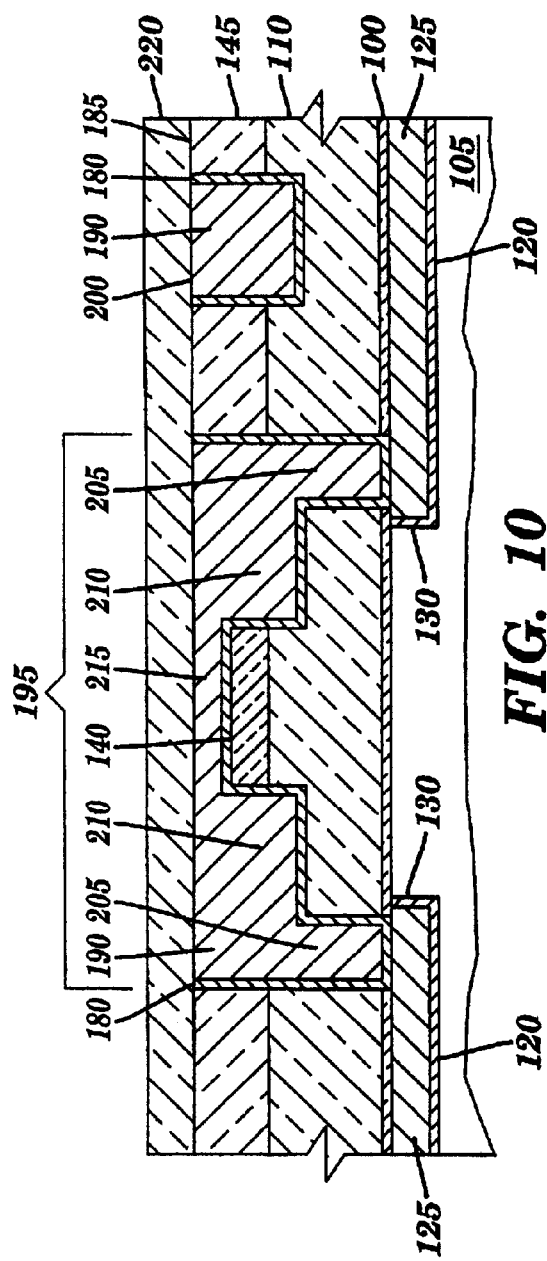

In FIG. 10, a passivation layer 220 is formed on top surface 185 of second dielectric layer 145, wire 200 and fuse 195. In one example, passivation layer 220 comprises about 0.035 to 0.12 microns of silicon nitride over about 0 to 0.5 microns of silicon oxide over about 0 to 0.5 microns of silicon nitride.

Figure 11:
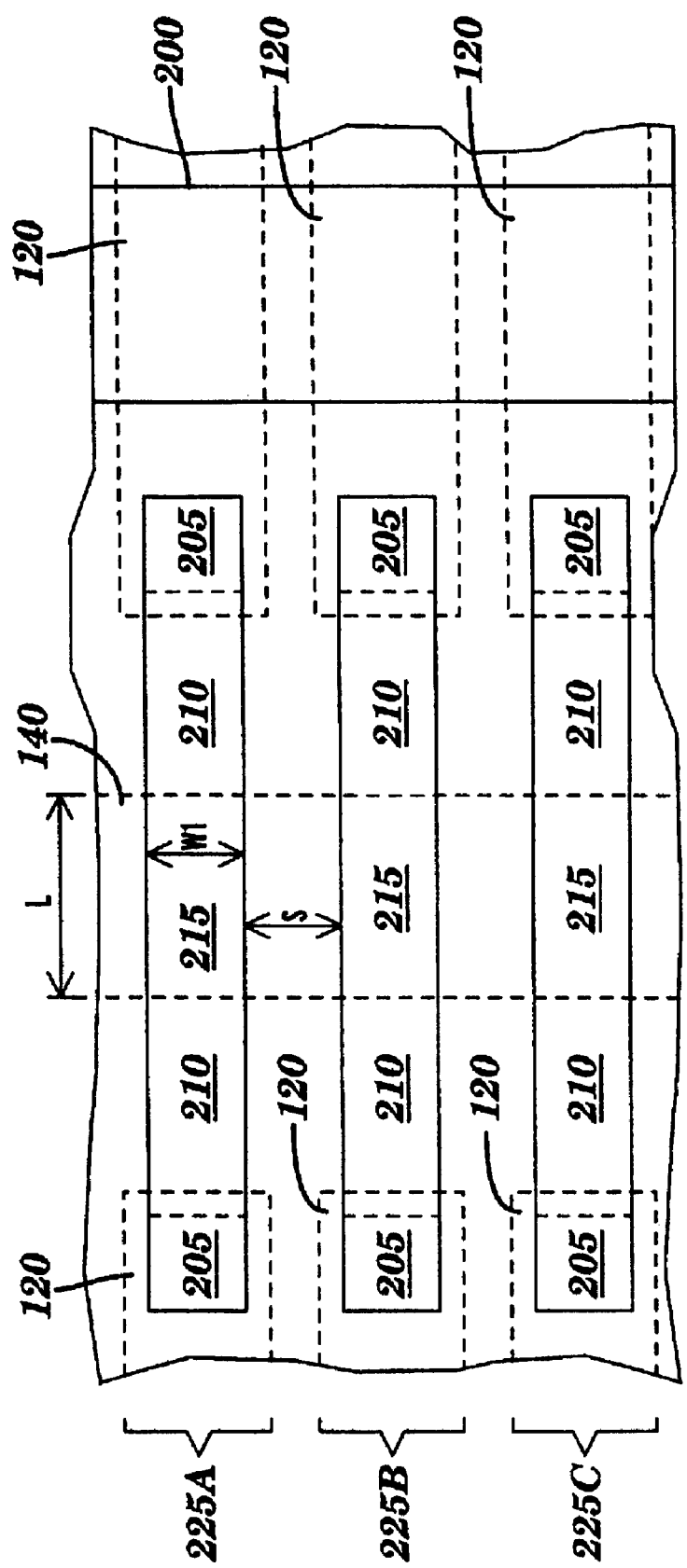
FIGS. 11 through 14 are top views of alternative embodiments of the triple damascene fuse according to the present invention.

FIGS. 11 through 14 are top views of alternative embodiments of the triple damascene fuse according to the present invention. FIG. 11 illustrates a first embodiment of the present invention. In FIG. 11, three fuses 225A, 225B and 225C are illustrated. Fusible portion 215 of each fuse 225A, 225B and 225C has a length "L" equal to the width of mandrel 140. The width of each fusible portion is the same as the width "W1" of connecting portions 210. Mandrel 140 is common to each fuse 225A, 225B and 225C. In each fuse 225A, 225B and 225C, connecting portion 210 connects fusible portion 215 to contact portion 205. Each contact portion 205 is in electrical contact with conductive wire(s) 120. Fuses 225A, 225B and 225C are spaced a distance "S" apart. Also illustrated in FIG. 11, is wire 200. In one example, "L" is about 8 to 20 microns, "W1" is about 0.3 to 1.8 microns and "S" is about 1 to 10 microns. If a laser is used to delete fusible portion 215 comprised of copper, a laser with a wavelength of 1.3 microns and having a pulse duration sufficient to provide 0.5 to 3.9 micro-joules will suffice if the thickness of passivation layer 220 is less than about 1.1 microns.

Figure 12:
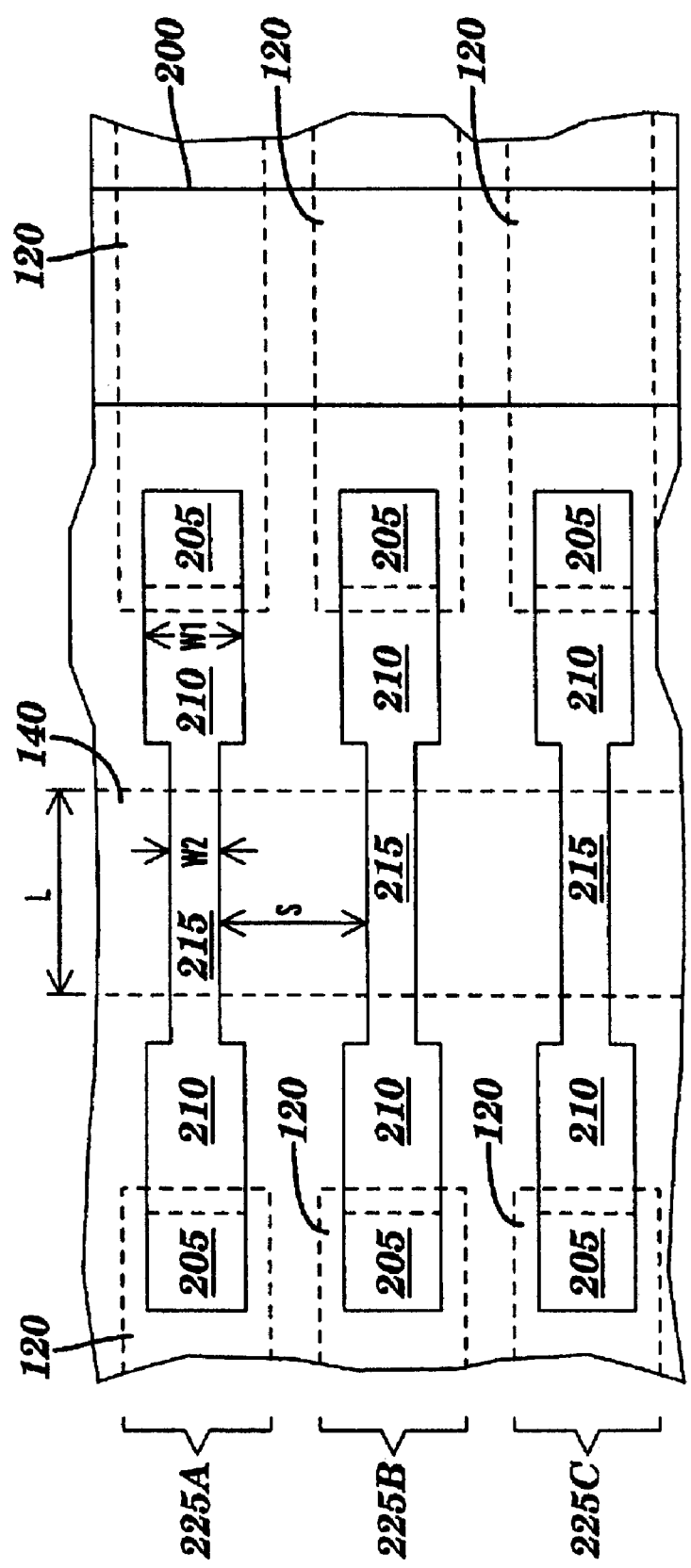

FIG. 12 illustrates a second embodiment of the present invention. In FIG. 12, three fuses 225A, 225B and 225C are illustrated. Fusible portion 215 of each fuse 225A, 225B and 225C has a length "L" equal to the width of mandrel 140. Mandrel 140 is common to each fuse 225A, 225B and 225C. The width of each fusible portion "W2" is less than the width "W1" of connecting portions 210. Each fuse 225A, 225B and 225C, connecting portion 210 connects fusible portion 215 to contact portion 205. Each contact portion 205 is in electrical contact with conductive wire(s) 120. Fuses 225A, 225B and 225C are spaced a distance "S" apart. Also illustrated in FIG. 12, is wire 200. In one example, "L" is about 8 to 20 microns, "W2" is about 0.3 to 1.8 microns and "S" is about 1 to 10 microns. If a laser is used to delete fusible portion 215 comprised of copper, a laser with a wavelength of 1.3 microns and having a pulse duration sufficient to provide 0.5 to 3.9 micro-joules will suffice if the thickness of passivation layer 220 is less than about 1.1 microns.

Figure 13:
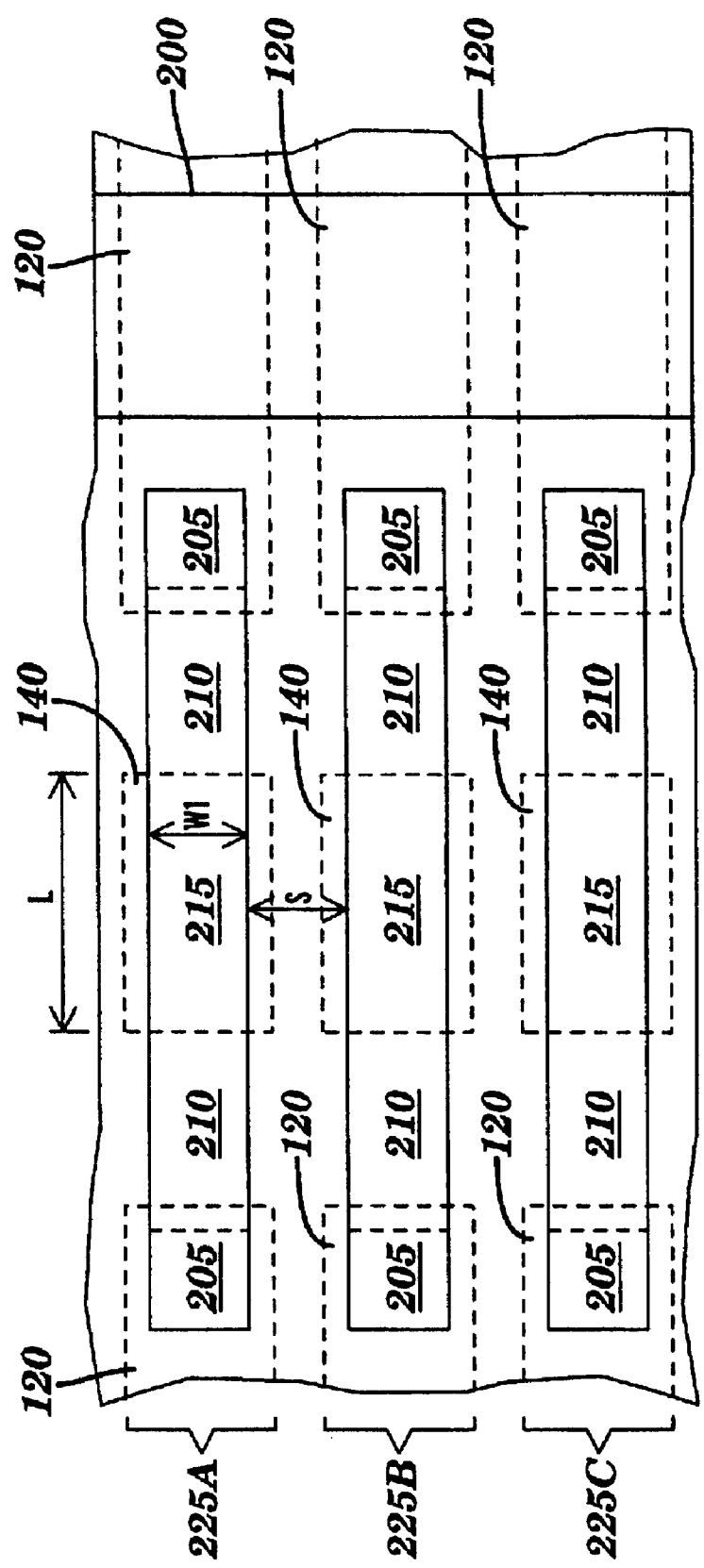

FIG. 13 illustrates a third embodiment of the present invention. In FIG. 13, three fuses 225A, 225B and 225C are illustrated. Fusible portion 215 of each fuse 225A, 225B and 225C has a length "L" equal to the width of mandrel 140. The width of each fusible portion is the same as the width "W1" of connecting portions 210. A separate mandrel 140 is provided for each fuse 225A, 225B and 225C. Each fuse 225A, 225B and 225C, connecting portion 210 connects fusible portion 215 to contact portion 205. Each contact portion 205 is in electrical contact with conductive wire(s) 120. Fuses 225A, 225B and 225C are spaced a distance "S" apart. Also illustrated in FIG. 13, is wire 200. In one example, "L" is about 8 to 20 microns, "W1" is about 0.3 to 1.8 microns and "S" is about 1 to 10 microns. If a laser is used to delete fusible portion 215 comprised of copper, a laser with a wavelength of 1.3 microns and having a pulse duration sufficient to provide 0.5 to 3.9 micro-joules will suffice if the thickness of passivation layer 220 is less than about 1.1 microns.

Figure 14:
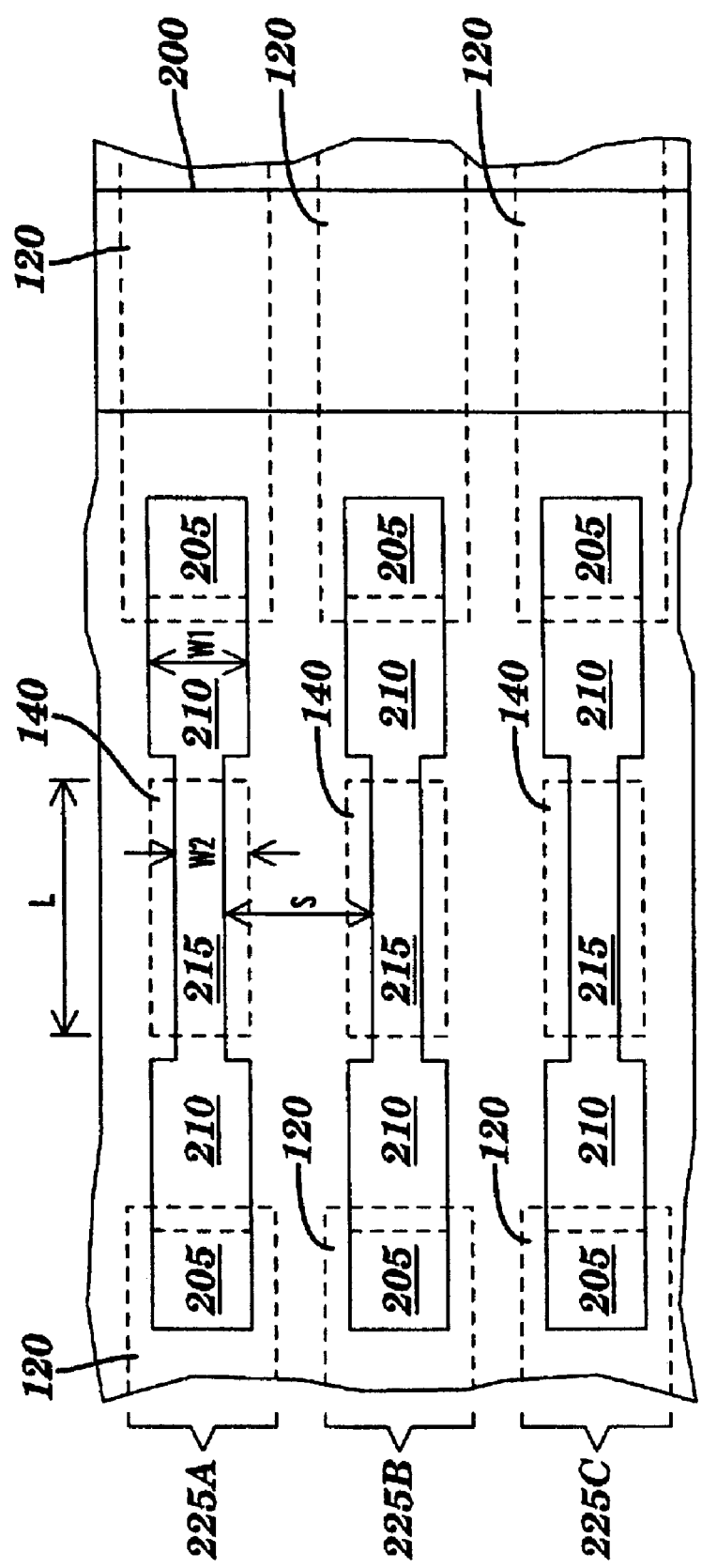

FIG. 14 illustrates a fourth embodiment of the present invention. In FIG. 14, three fuses 225A, 225B and 225C are illustrated. Fusible portion 215 of each fuse 225A, 225B and 225C has a length "L" equal to the width of mandrel 140. A separate mandrel 140 is provided for each fuse 225A, 225B and 225C. The width of each fusible portion "W2" is less than the width "W3" of connecting portions 210. Each fuse 225A, 225B and 225C, connecting portion 210 connects fusible portion 215 to contact portion 205. Each contact portion 205 is in electrical contact with conductive wire(s) 120. Fuses 225A, 225B and 225C are spaced a distance "S" apart. Also illustrated in FIG. 14, is wire 200. In one example, "L" is about 8 to 20 microns, "W2" is about 0.3 to 1.8 microns and "S" is about 1 to 10 microns. If a laser is used to delete fusible portion 215 comprised of copper, a laser with a wavelength of 1.3 microns and having a pulse duration sufficient to provide 0.5 to 3.9 micro-joules will suffice if the thickness of passivation layer 220 is less than about 1.1 microns.

It should be noted that while mandrel 140 is necessary to the fabrication of fuse 195, the mandrel also acts to protect the underlying dielectric and metal layers from damage caused by "deleteing" the fuse. Mandrel 140, also acts to contain the fuse blow energy, allowing lower power to be used, limiting collateral damage and allowing tighter pitch fuses.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. For example, the fuse of the present invention may be fabrication in the next to last metal level (LM-1). Therefore, it is intended that the following claims cover all such modifications and changes as fall within the true spirit and scope of the invention.

What is claimed is:

1. A conductive fuse for a semiconductor device, comprising:
   a pair of contact portions integrally connected to a fusible portion by connecting portions;
   said contact portions thicker than said connecting portions and said connecting portions thicker than said fusible portion;
   a first dielectric under said connecting portions and said fusible portion and extending between said pair of contact portions; and
   a second dielectric between said first dielectric and said fusible portion, said second dielectric extending between said connecting portions and defining the length of said fusible portion.

2. The conductive fuse of claim 1, wherein top surfaces of said contact, connecting and fusible portions are co-planer.

3. The conductive fuse of claim 1, wherein said contact portions, said connecting portions and said fusible portion comprises a conductor formed by a damascene process.

4. The conductive fuse of claim 1, wherein said contact portions, connecting portions and fusible portion comprises a material selected from the group consisting of copper, aluminum or aluminum-copper, aluminum-copper-silicon and aluminum alloy.

5. The conductive fuse of claim 1, wherein said fuse comprises a conductor formed by a damascene process, said conductor comprising a conductive liner and a conductive case.

6. The conductive fuse of claim 5, wherein:
   said conductive liner comprises material selected from the group consisting of titanium, titanium nitride, tantalum, tantalum nitride, tungsten, tungsten nitride, chromium and layers thereof; and
   said core conductor is comprises material selected from the group consisting of copper, aluminum, aluminum-copper, aluminum-copper-silicon and aluminum alloys.

7. The conductive fuse of claim 1, wherein said second dielectric is selectively etchable with respect to said first dielectric.

8. The conductive fuse of claim 1, wherein:
   said first dielectric is selected from the group consisting of silicon nitride, silicon carbide, boron nitride and aluminum oxide; and
   said second dielectric is selected from the group consisting of silicon oxide, silicon nitride, diamond, fluorine doped silicon oxide, spin on glass, porous silicon oxide, polyimide, polyimide siloxane, polysilsequioxane polymer, benzocyclobutene, paralyene, polyolefin, poly-naphthalene fluropolymer resin, polyphenylene oligomer, methane doped silica, polymer foam and aerogel.

9. The conductive fuse of claim 1, wherein:
   said connecting portions are between 0.13 and 2.0 microns thick; and
   said fusible portion is between 0.075 and 1.5 microns thick.

10. A semiconductor device, comprising:
    a semiconductor substrate having integrated circuits; and
    at least one fuse, said fuse comprising:
        a pair of contact portions integrally connected to a fusible portion by connecting portions;
        said contact portions thicker than said connecting portions and said connecting portions thicker than said fusible portion;
        a first dielectric under said connecting portions and said fusible portion and extending between said pair contact portions; and
        a second dielectric between said first dielectric and said fusible portion, said second dielectric extending between said connecting portions and defining the length of said fusible portion.

11. The device of claim 10, wherein top surfaces of said contact, connecting and fusible portions are co-planer.

12. The device of claim 10, wherein said fuse comprises a conductor formed by a damascene process.

13. The device of claim 10, wherein said fuse comprises copper, aluminum or aluminum-copper, aluminum-copper-silicon or aluminum alloy.

14. The device of claim 10, wherein said flue comprises a conductor toned by a damascene process, said conductor comprising a conductive liner and a conductive core.

15. The device of claim 14, wherein:
    said conductive liner is selected from the group consisting of titanium, titanium nitride, tantalum, tantalum nitride, tungsten, tungsten nitride, chromium and layers thereof; and
    said core, conductor is selected from the group consisting of copper, aluminum, aluminum-copper, aluminum-copper-silicon and aluminum alloys.

16. The device of claim 10, wherein said second dielectric is selectively etchable with respect to said first dielectric.

17. The device of claim 10, wherein:
    said first dielectric is selected from the group consisting of silicon nitride, silicon carbide, boron nitride and aluminum oxide; and
    said second dielectric is selected from the group consisting of silicon oxide, silicon nitride, diamond, fluorine doped silicon oxide, spin on glass, porous silicon oxide, polyimide, polyimide siloxane, polysilsequioxane polymer, benzocyclobutene, paralyene, polyolefin, poly-naphthalene, fluropolymer resin, polyphenylene oligomer, methane doped silica, polymer foam and a aerogel.

18. The device of claim 10, wherein:
    said connecting portions are between 0.13 and 2.0 microns thick; and
    said fusible portion is between 0.075 and 1.5 microns thick.

19. A conductive fuse for a semiconductor device, comprising:
    a pair of contact portions of uniform thickness, each contact portion integrally connected to a fusible portion by a different connecting portion;
    said contact portions thicker than said connecting portions and said connecting portions thicker than said fusible portion;
    said connecting portions on top of and directly contacting a first dielectric layer; and
    a second dielectric layer between said fusible portion and said first dielectric, said second dielectric on top of and in direct contact with said first dielectric layer and under and in direct contact with said fusible portion, said second dielectric extending between said connecting portions under said fusible portion.

20. The conductive fuse of claim 19, wherein top surfaces of said contact, connecting and fusible portions are substantially co-planer.

21. The conductive fuse of claim 19, wherein said contact portions, said connecting portions and said fusible portion comprise a material selected from the group consisting of copper, aluminum, aluminum-copper, aluminum-copper-silicon and aluminum alloy.

22. The conductive fuse of claim 19, wherein said contact portions, said connecting portions and said fusible portion comprise a conductor comprising a conductive liner and a conductive core.

23. The conductive fuse of claim 22, wherein:

said conductive liner comprises a material selected from the group of consisting of titanium, titanium nitride, tantalum, tantalum nitride, tungsten, tungsten nitride, chromium and layers thereof; and said core conductor comprises a material selected from the group consisting of copper, aluminum, aluminum-copper, aluminum-copper-silicon and aluminum alloys.

24. The conductive fuse of claim 19, wherein said second dielectric layer is selectively etchable with respect to said first dielectric layer.

25. The conductive fuse of claim 19, wherein:

said first dielectric layer comprises a material selected from the group consisting of silicon nitride, silicon carbide, boron nitride and aluminum oxide; and said second dielectric layer comprises a material selected from the group consisting of silicon oxide, silicon nitride, diamond, fluorine doped silicon oxide, spin on glass, porous silicon oxide, polyimide, polyimide siloxane, polysilsequioxane polymer, benzocyclobutene, paralyene, polyolefin, polynaphthalene, fluropolymer resin, polyphenylene oligomer, methane doped silica, polymer foam arid aerogel.

26. The conductive fuse of claim 19, wherein:

said connecting portions are between 0.13 and 2.0 microns thick; and said fusible portion is between 0.075 and 1.5 microns thick.

27. A conductive fuse for a semiconductor device, comprising:

contact portions of uniform thickness, each contact portion integrally connected to a fusible portion by a different connecting portion;

said contact portions thicker than said connecting portions and said connecting portions thicker than said fusible portion;

said connecting portions on top of and in direct contact with a first dielectric layer; and a second dielectric layer on top of and in direct contact with said first dielectric layer and under and in direct contact with said fusible portion, said second dielectric layer extending between said connecting portions under said fusible portion; and a third dielectric layer on top of and in direct contact with said first dielectric layer, said first and third dielectric layers in direct contact with outer sidewalls of said contact portions.

28. The conductive fuse of claim 27, wherein top surfaces of said contact, connecting and fusible portions and said third dielectric layer are substantially co-planer.

29. The conductive fuse of claim 27, wherein said contact portions, said connecting portions and said fusible portion comprises a material selected from the group consisting of copper, aluminum or aluminum-copper, aluminum-copper-silicon, aluminum alloy, titanium, titanium nitride, tantalum, tantalum nitride, tungsten, tungsten nitride, chromium and combinations thereof.

30. The conductive fuse of claim 27, wherein:

said first dielectric layer comprises material selected from the group consisting of silicon nitride, silicon carbide, boron nitride and aluminum oxide; and said second and third dielectrics comprise materials independently selected from the group consisting of silicon oxide, silicon nitride, diamond, fluorine doped silicon oxide, spin on glass, porous silicon oxide, polyimide, polyimide siloxane, polysilsequioxane polymer, benzocyclobutene, paralyene, polyolefin, polynaphthalene, fluropolymer resin, polyphenylene oligomer, methane doped silica, polymer foam and aerogel.

* * * * *